United States Patent
Lee

[11] Patent Number: 6,090,698
[45] Date of Patent: Jul. 18, 2000

[54] FABRICATION METHOD FOR AN INSULATION STRUCTURE HAVING A LOW DIELECTRIC CONSTANT

[75] Inventor: Tong-Hsin Lee, Taipei Hsien, Taiwan

[73] Assignees: United Microelectronics Corp; United Silicon Incorporated, both of Hsinchu, Taiwan

[21] Appl. No.: 09/359,518
[22] Filed: Jul. 23, 1999
[51] Int. Cl.[7] ............................................. H01L 21/4763
[52] U.S. Cl. ........................ 438/619; 438/622; 438/623; 438/624; 438/639
[58] Field of Search ........................... 438/619, 622, 438/623, 624, 637, 639, 627, 629; 257/758, 759, 760

[56] References Cited

U.S. PATENT DOCUMENTS

| | | | |
|---|---|---|---|
| 5,252,517 | 10/1993 | Blalock et al. | 438/396 |
| 5,275,972 | 1/1994 | Ogawa et al. | 438/624 |
| 5,324,683 | 6/1994 | Fitch et al. | 438/422 |
| 5,408,130 | 4/1995 | Woo et al. | 257/758 |
| 5,616,960 | 4/1997 | Noda et al. | 257/760 |
| 5,953,625 | 9/1999 | Bang | 438/619 |

*Primary Examiner*—T. N. Quach
*Attorney, Agent, or Firm*—Thomas, Kayden, Horstemeyer & Risley

[57] ABSTRACT

A low-dielectric constant insulation structure is described in which low-dielectric constant insulation layers and silicon oxide layers are alternately stacked on the substrate to form a stacked insulation layer. A required pattern is then etched in the stacked insulation layer followed by a selective etching to remove a portion of the low dielectric insulation layer to form, starting from the sidewall of the stacked insulation layer and extending inwardly, a plurality of recessed regions. A sputtering deposition and etching-back are further conducted on the sidewall of the stacked insulation layer to form a sidewall spacer to enclose the already formed recessed regions. A plurality of air-gaps is formed in the stacked insulation layer to establish a low dielectric insulation structure.

29 Claims, 2 Drawing Sheets

FABRICATION METHOD FOR AN INSULATION STRUCTURE HAVING A LOW DIELECTRIC CONSTANT

BACKGROUND OF THE INVENTION

1. Field of the Invention

The present invention relates to a fabrication method for a semiconductor device. More particularly, the present invention relates to a fabrication method for a low dielectric insulation structure comprising an air-gap.

2. Description of the Related Art

Advances in the semiconductor technology continuously decrease the semiconductor device dimension into the deep sub-micron territory. As the density of an integrated circuitry increases, the wafer surface becomes insufficient for the manufacturing of the necessary numbers of interconnects. To accommodate the increased number of interconnects, the multi-level metal conductive connect design becomes the approach for the Very Large Scale Integration technology.

The continuous decrease in the distance between the metal conductive layers, however, is accompanied by an increase in the aspect ratio of the dielectric layer between the metal conductive layers. The coupling capacitance between the metal conductive layers is thereby increased leading to the formation of a parasitic capacitance.

The parasitic capacitance in a microelectronic device contributes to the effect such as an increase of the RC delay time when electronic signals are being transmitted between the metal linings. As a result, the speed of the electronic signal transmission between the metal linings is retarded and the operational speed of the semiconductor device is limited.

In order to reduce the RC time delay on signal transmissions, currently copper metal (with an electrical resistivity of approximately 1.7 microohm-cm) has been employed to replace the aluminum metal (with an electrical resistivity of approximately 2.7 microohm-cm) as conductive linings for the connect system to lower the resistance of the metal conductive linings. According to the formula of "$C=\epsilon(A/d)$", lowering the parasitic capacitance by altering the geometric parameters such as the conductive lining area A and the thickness d of the dielectric layer between two electrodes of the equivalent capacitor are another two approaches to reduce the RC time delay. However, the geometric approach is not a feasible approach due to limitations of the process condition and the conductive resistance. The research on low dielectric constant ematerials, as a result, has become a major developmental trend in the semiconductor industry.

The inter metal dielectric (IMD) layer for use in between the metal conductive linings, in general, requires to have properties such as high reliability, high mechanical strength, easy manufacturing, non-hygroscopic and easy to incorporate with the metal conductive linings. Currently, materials with a low dielectric constant that are being developed are mainly the spin on polymer (SOP) and the organic spin on glass (OSOG) with a dielectric constant of approximately between 2 to 4. The structure of the SOP and OSOG types of dielectric material, however, is slightly loose, and the mechanical strength of these materials is less favorable, comparing to the silicon oxide material. Furthermore, these newly developed dielectric materials are hygroscopic. The penetration of water vapor into the dielectric layer, which further leads to the occurrence of out-gassing during the subsequent formation of the metal plug and a poison phenomenon, is resulted.

As the manufacturing of semiconductors enters the deep sub-micron territory, the dielectric layer requires an even lower dielectric constant to accommodate the diminishment of the device dimension and to improve the performance of the device. Air, having a dielectric constant close to one and being inexpensive, has become one of the dielectric materials currently under development. If air can be used as a dielectric material, the insulation effect can be highly increased.

SUMMARY OF THE INVENTION

In the light of the forgoing, the current invention provides a fabrication method for a low dielectric insulation structure, in which a silicon oxide structure with enclosed air-gaps is provided and the need to develop new dielectric materials is eliminated. The silicon oxide structure with enclosed air-gaps can form the low dielectric insulation structure having a low dielectric constant between the conductive linings to lower the RC time delay and to increase the operating speed of the device. Furthermore, it also has a good mechanical strength, and thereby free from problems caused by structural stress.

The present invention also provides a fabrication method of a low dielectric insulation structure having a low dielectric constant, in which a stacked insulation layer is formed on a substrate, including at least two different insulation layers, a top and a bottom layers. Organic polymers with a lower dielectric constant are preferred for the bottom insulation layer. An insulating material with a more densely packed structure is preferred for the top insulation layer to protect the structure of the bottom layer from the penetration of metal in the subsequent metalization process. An even better structure is resulted if the stacked layer is formed with two layers being alternately stacked. A predetermined portion of the stacked insulation layer is removed to form an opening in the stacked insulation layer, such as an opening of the metal interconnect and to form the required pattern. A selective etching is further conducted to remove a portion of the bottom insulation layer, starting from the sidewall of the stacked insulation layer and proceeding inward to the center of the stacked insulation layer to form a plurality of recessed regions. After which, sputtering deposition or etching-back is conducted to form a sidewall spacer on the sidewall of the stacked insulation layer to enclose the previously formed recessed regions and to form a plurality of air-gaps in the stacked insulation layer. A conductive barrier layer is then formed in the opening, followed by filling the opening with a conductive material to form a conductive structure such as a metal interconnect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
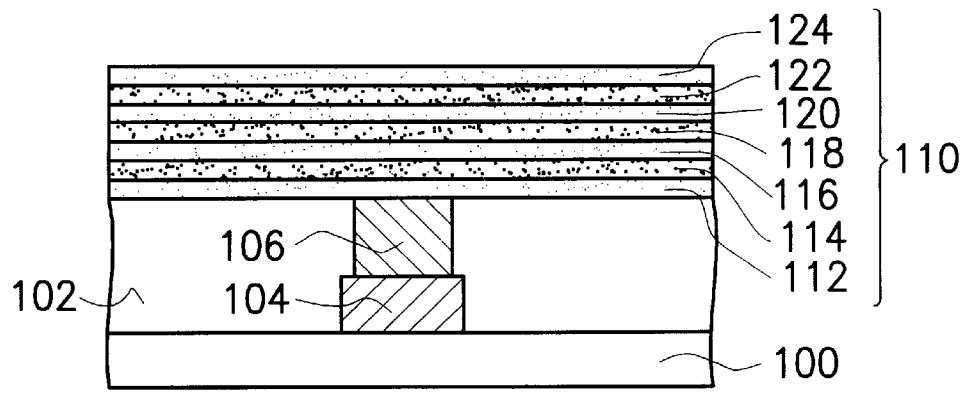
FIGS. 1A to 1E are schematic, cross-sectional views of a semiconductor device showing the manufacturing steps for a low dielectric insulation structure according to the preferred embodiment of the current invention

The present invention provides a fabrication method for a low dielectric insulation structure, which is applicable to use in between two adjacent electrodes for providing a good insulation effect. These electrodes can be two adjacent conductive linings or two adjacent capacitors or other conductive structures. Although in this preferred embodiment, the present invention is only described with respect to metal linings, it is intended that the present invention also covers modifications and variations of this invention provided they fall within the scope of the following claims and their equivalents Referring to FIG. 1A, a semiconductor substrate 100 is provided, and the manufacturing of the device is partially completed on the semiconductor substrate 100, for example, a metal oxide semiconductor (MOS) and a device isolation such as a shallow trench isolation (Not shown in Figure).

A conductive layer 104 is formed on the substrate 100. The conductive layer 104 is simply a symbol to represent the conductive structure located in the bottom layer which is likely to become a gate, a source/drain region, an electrode for the capacitor, a conductive lining for connecting the various devices, or other conductive structures for the transistor device. The conductive layer 104 is insulated from the neighboring conductive layer by the insulation layer 102 and is electrically connected through the conductive plug 106 with the upper conductive layer formed subsequently. The conductive plug 106 is, for example, the commonly known contact plug or via plug. The insulation layer 102, the conductive layer 104 and the plug are only to illustrate the electrical connection between the subsequently formed upper layer conductive structure and the bottom layer conductive structure (the conductive layer 104) through the plug 106. Their manufacturing procedures are familiar techniques to those skilled in the art, therefore will not be reiterated in the current embodiment.

Still referring to FIG. 1A, a stacked insulation layer 110 is formed on the insulation layer 102 and the plug 106. The stacked insulation layer consists of at least two different insulation layers, an upper and a lower insulation layers. Materials selected for the two insulation layers are required to have a high selectivity for the selective etching process conducted subsequently. For example, the lower insulation layer (the first insulation layer) uses an organic polymer with a lower dielectric constant. The upper insulation layer (the second insulation layer) is preferred to have a densely packed structure to provide a protection for the lower insulation layer and to prevent the penetration of the metal layer during the subsequently metalizing process. Materials used for the first insulation layer like the spin on polymer (SOP) including flare, SILK, parylene PAE-II, or the organic spin on glass (OSOG) such as silsequioxane. The second insulation layer includes a plasma enhanced chemical vapor deposited (PECVD) silicon oxide layer. If the stacked insulation layer is formed by alternately stacking the first insulation layer and the second insulation layer as shown in FIG. 1A, a better structure is resulted. The first insulation layer includes insulation layers 114, 118 and 122 in the Figure, and the second insulation layer includes insulation layers 112, 116, 120 and 124. Forming the second insulation layer 112 underneath the first insulation layer 114 is to a provide a protection for the bottom of the first insulation layer 114 and to prevent the penetration of the underlying metal layer in the subsequent step of thermal treatment. Whether to form the second insulation layer 112 is dependent on the actual conditions.

Figure 1B:
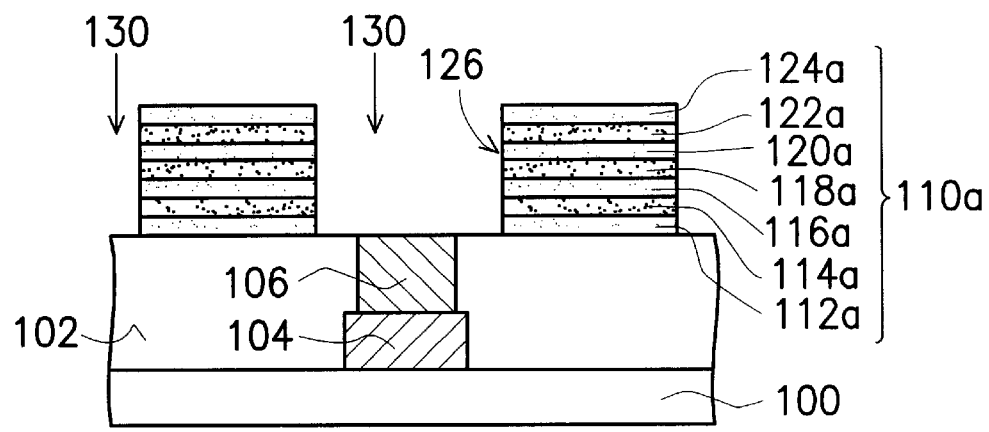

As shown in FIG. 1B, a predetermined portion of the stacked insulation layer 110 is removed by the traditional photolithography and etching method to form an opening 130 exposing the plug 106 and a portion of the insulation layer 102. The required pattern is formed, for example, an opening of the metal interconnect, and a patterned stacked insulation layer 110a is thereby resulted. The openings 130 are formed exposing the sidewall 126 of the stacked insulation layer 100a.

Figure 1C:
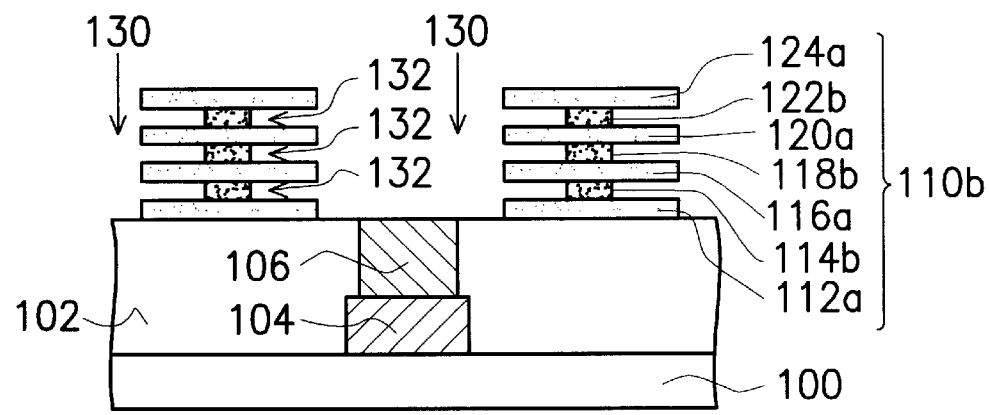

According to FIG. 1C, an etching solvent, which is highly selective to the first insulation layer and the second insulation layer, is used to selectively etch along the sidewall 126 of the patterned stacked insulation layer 110a. The etching proceeds inwardly to remove a portion of the first insulation layers 114a, 118a and 112a of the patterned stacked insulation layer 110a to form the stacked insulation layer 110b. A plurality of recessed regions 132 is then formed in the stacked insulation layer 110b. Using an etching solvent that has a lower etching rate on the first insulation layer provides a better control on the etching rate on the first insulation layer and on the width of the recessed regions 132 (same as the depth into the stacked insulation layer 110b). The sum of the widths of the recessed regions on both sides of the stacked insulation layer must be less than the minimum width between the two neighboring openings 130. This implies that a portion of the adjacent first insulation layers, above and below the second insulation layer, is retained to provide a proper support for the second insulation layer above. The first insulation layer is therefore prevented from completely being etched which may lead to a collapse of the stacked insulation layer 110b.

Figure 1D:
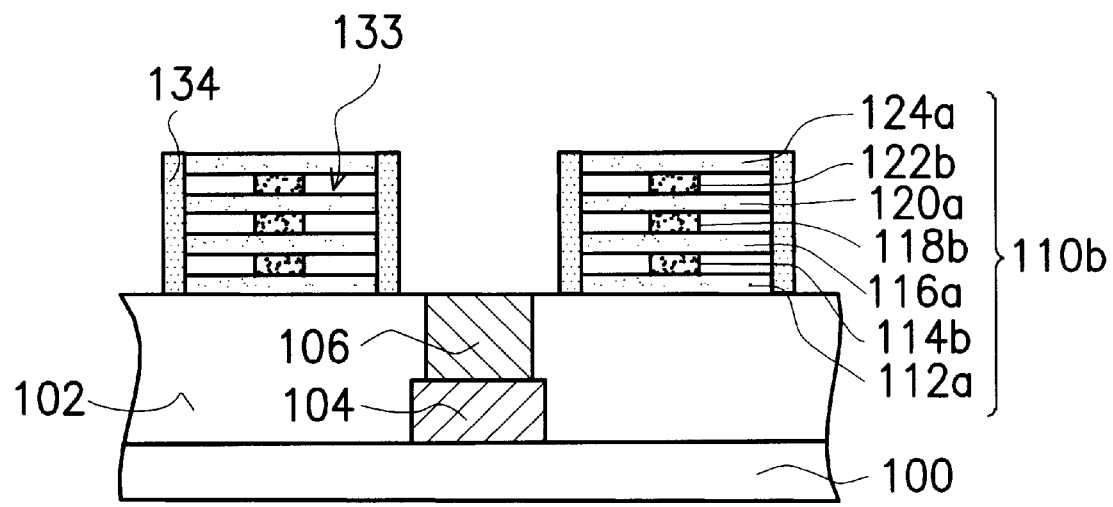

As shown in FIG. 1D, a sidewall spacer 134, which is connected from top to bottom, is formed on the sidewall 126 of the stacked insulation layer 110b. The connected sidewall spacer 134, starting from the sidewall of the upper most second insulation layer 124 and extending to the lowest second insulation layer 112, is connected to the underlying insulation layer 102 to enclose the recessed regions 132 in the stacked insulation layer 110b. A plurality of air-gaps 133 is thereby formed in the stacked insulation layer 110b. The sidewall spacer 134 is preferably formed by a sputtering deposition of a conformal silicon oxide layer on the substrate 100 such as an ECR deposited-sputtered oxide. Forming the silicon oxide layer by means of sputtering is because the sideway filling capability of the sputtering method is poor thereby preventing the silicon oxide to enter and to fill up the recessed regions, hence affecting the formation of air-gaps 133. An etching-back is then conducted to remove a portion of the silicon oxide layer resulting a sidewall spacer 134 with a uniformed thickness. If the insulation layer 102 comprises an etching stop layer, it will be easier to control the etching-back process and will form a better sidewall spacer.

While forming the air-gaps 133 in the reaction chamber, the recessed regions 132 are naturally filled with gas, which is being enclosed by the sidewall spacer in the stacked insulation layer 110b. The gas that is being referred here is air. The stacked insulation layer 110b is formed by the silicon oxide layers, the low-dielectric constant insulation layers and the air-gaps. The dielectric constant for the silicon oxide layers (including the sidewall spacer) is approximately 4.0 to 4.9, for the low-dielectric constant insulation layers is approximately 2 to 4, and for the air-gaps 133 is approximately 1. The insulation structure having a low dielectic constant (such as the stacked insulation layer 110b) formed according to the present invention has a dielectric constant lower than that of the silicon dioxide and other general low dielectric materials.

Figure 1E:
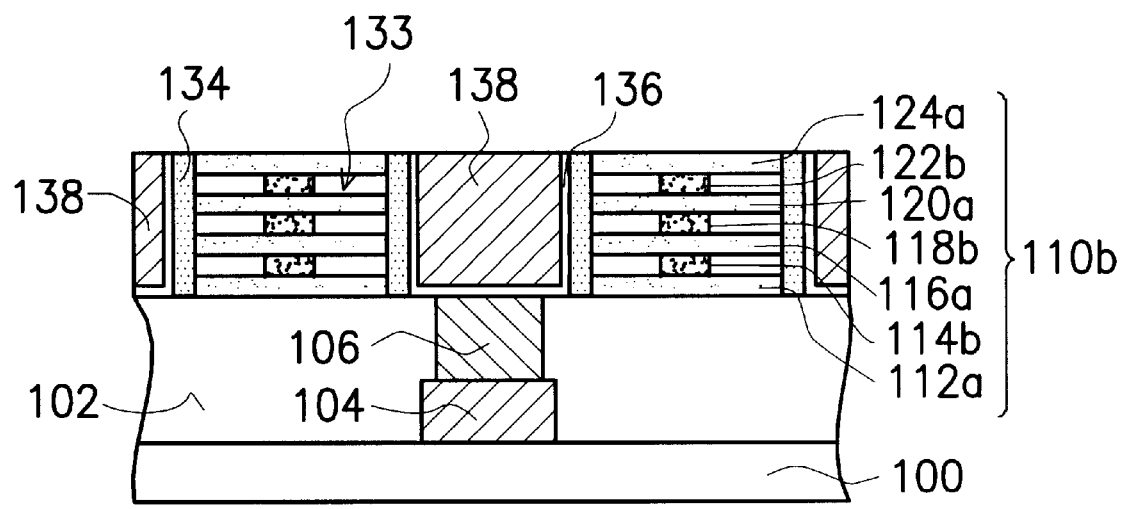

Referring to FIG. 1E, a conformal conductive barrier layer 136 is formed on the substrate 100 and the opening 130. The conductive barrier layer 136, such as titanium, titanium nitride, tantalum and tantalum nitride, is formed by metal sputtering or chemical vapor deposition (CVD). The opening 130 is then filled with a conductive material to form a conductive layer 138 such as the conductive lining for the metal interconnect. The conductive material includes aluminum or copper, and the conductive layer 138 is formed by first depositing a conductive material and filling the opening 130, followed by an etching-back or a chemical mechanical polishing (CMP) to remove the conductive material above the stacked insulation layer 110b. The process of forming the conductive layer 138 is not an essential part for the present invention, therefore will not be detailed in the current embodiment.

In the light of the above preferred embodiment, the current invention provides a fabrication method for a low dielectric insulation structure with enclosed air-gaps thereby a good insulation effect between two conductive structures is provided. As a result, the RC time delay is decreased and the operating speed of the device is increased. The current fabrication method not only is simple, it is also compatible with the conventional manufacturing process.

Although in the present embodiment, the present invention is described with respect to a metal lining. It is intended that the present invention also covers modifications and variations of this invention provided they fall within the scope of the following claims and their equivalents, including the areas of the dynamic random access memory cell or other related semiconductor devices. It will be apparent to those skilled in the art that various modifications and variations can be made to the structure of the present invention without departing from the scope or spirit of the invention.

What is claimed is:

1. A fabrication method for an insulation structure having a low dielectric constant, the fabrication method comprising the steps of:
    forming a stacked insulation layer on a substrate, the stacked insulation layer comprising at least a first insulation layer and a second insulation layer, wherein the second insulation layer is stacked on the first insulation layer;
    removing a predetermined portion of the stacked insulation layer to form the stacked insulation layer with a required pattern;
    conducting a selective etching to remove a portion of the first insulation layer starting from a sidewall of the patterned stacked insulation layer to form a plurality of recessed regions in the patterned stacked insulation layer; and
    forming a connected sidewall spacer extending from top to bottom on the sidewall of the patterned stacked insulation layer to enclose a plurality of air-gaps within the recessed regions in the stacked insulation layer.

2. The fabrication method according to claim 1, wherein the second insulation layer includes a silicon oxide layer formed by plasma enhanced chemical vapor deposition.

3. The fabrication method according to claim 1, wherein the first insulation layer includes an insulation layer having a low dielectric constant.

4. The fabrication method according to claim 3, wherein the insulation layer having the low dielectric constant includes a spin on organic polymer.

5. The fabrication method according to claim 3, wherein the insulation layer having the low dielectric constant includes organic spin on glass.

6. The fabrication method according to claim 1, wherein the first insulation layer and the second insulation layer respectively comprise one selected from the group consisting of: silicon oxide and dielectric having a low dielectric constant, and dielectric having a low dielectric constant and silicon oxide, but an upper most layer of the stacked insulation layer is a silicon oxide layer.

7. The fabrication method according to claim 1, wherein removing the predetermined portion of the stacked insulation layer forms an opening for a metal interconnect.

8. The fabrication process according to claim 1, wherein the connected sidewall spacer is formed by depositing a sputtered silicon oxide layer on the substrate followed by an etching-back to form the connected sidewall spacer.

9. The fabrication method according to claim 1, wherein the air-gaps are filled with gas.

10. A fabrication method for an insulation structure, having a low dielectric constant, the fabrication method comprising the steps of:
    forming a stacked insulation layer on the substrate, wherein the stacked insulation layer is formed by alternately stacking with a plurality of first insulation layer and second insulation layer, and an upper most layer for the stacked insulation layer is the second insulation layer;
    removing a predetermined portion of the stacked insulation layer to form the stacked insulation layer with a required pattern;
    conducting a selective etching to remove a portion of the first insulation layers; and
    forming a connected sidewall spacer on a sidewall of the stacked insulation layer, extending from top to bottom and connecting to the substrate, wherein a plurality of air-gaps are enclosed by the connected sidewall spacer and second insulation layer.

11. The fabrication method according to claim 10, wherein the second insulation layer includes a silicon oxide layer formed by plasma enhanced chemical vapor deposition.

12. The fabrication method according to claim 10, wherein the first insulation layer includes an insulation layer having a low dielectric constant.

13. The fabrication method according to claim 12, wherein the insulation layer having the low dielectric constant includes spin on polymer.

14. The fabrication method according to claim 12, wherein the insulation layer having the low dielectric constant includes organic spin on glass.

15. The fabrication method according to claim 10, wherein the predetermined portion of the stacked insulation layer is removed to form including an opening for a metal interconnect.

16. The fabrication method according to claim 10, wherein the connected sidewall spacer is formed by sputtering a silicon oxide layer to cover the substrate followed by an etching-back to form the connected sidewall spacer.

17. The fabrication method according to claim 10, wherein the air-gaps are filled with gas.

18. A fabrication method for an insulation structure having a low dielectric constant, the fabrication method comprising the steps of:
    forming a stacked insulation layer on the substrate, wherein the stacked insulation layer is formed by alternately stacking with at least one first insulation layer and at least one second insulation layer, and an upper most layer for the stacked insulation layer is the second insulation layer;
    removing a predetermined portion of the stacked insulation layer to form a metal interconnect opening;

conducting a selective etching to remove a portion of the first insulation layer to form a plurality of recessed regions in the stacked insulation layer starting from the sidewall of the stacked insulation layer;

forming a connected sidewall spacer on the sidewall of the stacked insulation layer to enclose the recessed regions and to form a plurality of air-gaps in the insulation layer; and filling the metal interconnect opening with a conductive material to form a metal interconnect.

19. The fabrication method according to claim 18, wherein the second insulation layer includes a silicon oxide layer formed by plasma enhanced chemical vapor deposition.

20. The fabrication method according to claim 18, wherein the first insulation layer includes an insulation layer having a low dielectric constant.

21. The fabrication method according to claim 20, wherein the insulation layer having the low dielectric constant includes spin on polymer.

22. The fabrication method according to claim 20, wherein the insulation layer having the low dielectric constant includes organic spin on glass.

23. The fabrication method according to claim 18, wherein the connected sidewall spacer is formed by including sputtering a silicon oxide layer to cover the substrate followed by an etching-back to form the connected sidewall spacer.

24. The fabrication method according to claim 18, wherein the air-gaps are filled with gas.

25. The fabrication method according to claim 18, wherein before filling the metal interconnect opening with the conductive material further includes forming a conductive barrier layer on a wall of the metal interconnect opening.

26. The fabrication method according to claim 25, wherein the conductive barrier layer includes a titanium layer.

27. The fabrication method according to claim 26, wherein the metal interconnect includes aluminum.

28. The fabrication method according to claim 25, wherein the conductive barrier layer includes a tantalum layer.

29. The fabrication method according to claim 28, wherein the metal interconnect includes copper.

* * * * *